US009583162B1

(12) United States Patent
Choi

(10) Patent No.: US 9,583,162 B1
(45) Date of Patent: Feb. 28, 2017

(54) NONVOLATILE MEMORY DEVICE FOR PERFORMING DUTY CORRECTION OPERATION, MEMORY SYSTEM, AND OPERATING METHOD THEREOF

(71) Applicant: SK hynix Inc., Gyeonggi-do (KR)

(72) Inventor: Hoon Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/981,446

(22) Filed: Dec. 28, 2015

(30) Foreign Application Priority Data

Aug. 20, 2015 (KR) .................. 10-2015-0117241

(51) Int. Cl.
*G11C 8/00* (2006.01)
*G11C 7/22* (2006.01)

(52) U.S. Cl.
CPC .................... *G11C 7/222* (2013.01)

(58) Field of Classification Search
CPC .................................... G11C 7/222
USPC ....................................... 365/233.1
See application file for complete search history.

(56) References Cited

U.S. PATENT DOCUMENTS

| 8,531,908 B2 | 9/2013 | Ma | |
| 2012/0105122 A1* | 5/2012 | Lee | H03K 5/1565 327/175 |
| 2012/0147692 A1* | 6/2012 | Nakamura | G11C 7/1066 365/233.1 |
| 2013/0250693 A1 | 9/2013 | Shimizu | |
| 2015/0364176 A1* | 12/2015 | Lee | G06F 11/0757 714/57 |
| 2016/0055917 A1* | 2/2016 | Lee | G11C 16/34 365/185.11 |

OTHER PUBLICATIONS

Im, Jae-Woo, A 128Gb 3-bit/Cell V-NAND Flash Memory with 1Gbps I/O rate.

* cited by examiner

*Primary Examiner* — Hoai V Ho
(74) *Attorney, Agent, or Firm* — IP & T Group LLP

(57) ABSTRACT

A nonvolatile memory device suitable for sequentially performing a ZQ calibration operation and a read operation in response to a ZQ calibration enable signal and a read enable signal. The nonvolatile memory device includes a duty ratio control block suitable for receiving the read enable signal, performing a duty correction operation and setting a duty ratio, in a ZQ calibration operation period, and receiving the read enable signal and outputting a duty-corrected clock based on the set duty ratio, in a read operation period; a clock generation block suitable for generating an internal clock signal in response to the duty-corrected clock; and a data output block suitable for outputting data outputted from an internal memory cell region, in synchronization with the internal clock signal.

28 Claims, 11 Drawing Sheets

US 9,583,162 B1

NONVOLATILE MEMORY DEVICE FOR PERFORMING DUTY CORRECTION OPERATION, MEMORY SYSTEM, AND OPERATING METHOD THEREOF

CROSS-REFERENCE TO RELATED APPLICATION

This application claims priority under 35 U.S.C. §119 to Korean Patent Application No. 10-2015-0117241 filed on Aug. 20, 2015 with the Korean Intellectual Property Office, the disclosure of which is incorporated herein by reference in its entirety.

TECHNICAL FIELD

The present invention relates generally to semiconductor design technology, and more particularly, to a nonvolatile memory device, a memory system and an operating method thereof.

DISCUSSION OF THE RELATED ART

A semiconductor memory device is a data storage device implemented on a semiconductor based integrated circuit formed on a semiconductor material such as silicon (Si), germanium (Ge), gallium arsenide (GaAs) and Indium phosphide (InP). Semiconductor memory devices are generally classified into volatile and nonvolatile memory devices.

A volatile memory device is a memory device which loses stored data when power supply is interrupted. Examples of volatile memory devices may include an SRAM (static RAM), a DRAM (dynamic RAM) and an SDRAM (synchronous DRAM). A nonvolatile memory device retains stored data even when power supply is interrupted. Examples of nonvolatile memory devices may include a ROM (read only memory), a PROM (programmable ROM), an EPROM (electrically programmable ROM), an EEPROM (electrically erasable and programmable ROM), a flash memory, a PRAM (phase change RAM), an MRAM (magnetic RAM), an RRAM (resistive RAM), and an FRAM (ferroelectric RAM). Flash memory devices are widely used and may be classified into NOR or NAND type.

As the operation speed of electronic devices continues to increase, higher data transmission speeds are also needed. However, generally, data transfer at high speeds, may be subject to signal distortion such as a jitter, a skew and a duty error may occur. Recently, in particular, with regards to flash memory systems, signal distortion at continuously increasing data transfer speeds has become problematic.

FIG. 1 is a block diagram illustrating a conventional flash memory device associated with a read interface.

Referring to FIG. 1, the flash memory device may include a clock generation block 10 and a data output block 20. The clock generation block 10 may generate a rising clock RCLK and a falling clock FCLK for an operation of the flash memory device, in response to a read enable signal RE/REB transmitted from a memory controller (not shown) in a read operation. For example, the read enable signal RE/REB is a signal which toggles in a preset cycle during a read operation. The data output block 20 may receive internal data DQ transmitted from a memory cell region (not shown), and may output data DATA in synchronization with the rising and falling clocks RCLK, FCLK.

If signal distortion occurs during a duty ratio of the read enable signal RE/REB, a setup/hold margin of the internal data DQ is likely to decrease, which may be a substantial burden to a high-speed operation. However, because the read enable signal RE/REB toggles only during a read operation, it is difficult to perform duty ratio correction for the read enable signal RE/REB.

Furthermore, because a read enable signal RE/REB is applied from the memory controller to the flash memory device, even when the memory controller retains the duty ratio of the read enable signal RE/REB at 50%, a duty error may occur while the read enable signal RE/REB is transmitted to the flash memory device and a duty error may also occur inside the flash memory device. Therefore, a limitation exists in that it is difficult to retain the duty ratio of the read enable signal RE/REB at a desired value, for example, 50%.

SUMMARY

Various embodiments are directed to a nonvolatile memory device, a memory system including the same, and an operating method thereof, capable of generating a clock with a corrected duty ratio through a duty correction operation and thereby performing transmission of highly reliable data.

Also, various embodiments are directed to a nonvolatile memory device, a memory system including the same, and an operating method thereof, capable of performing a duty correction operation only when a high-speed operation is needed and thereby performing a low power operation.

In an embodiment, a memory system may include: a memory controller; and a nonvolatile memory device suitable for performing a specified operation in response to a command inputted from the memory controller, wherein the nonvolatile memory device sequentially performs a ZQ calibration operation and a read operation in response to a ZQ calibration enable signal and a read enable signal inputted from the memory controller, wherein, in a ZQ calibration operation period, the memory controller outputs the read enable signal to the nonvolatile memory device, and the nonvolatile memory device performs a duty correction operation in response to the read enable signal and sets a duty ratio, and wherein, in a read operation period, the nonvolatile memory device generates an internal clock signal based on the set duty ratio, and outputs data in synchronization with the internal clock signal.

In an embodiment, a nonvolatile memory device suitable for sequentially performing a ZQ calibration operation and a read operation in response to a ZQ calibration enable signal and a read enable signal may include: a duty ratio control block suitable for receiving the read enable signal, performing a duty correction operation and setting a duty ratio, in a ZQ calibration operation period, and receiving the read enable signal and outputting a duty-corrected clock based on the set duty ratio, in a read operation period; a clock generation block suitable for generating an internal clock signal in response to the duty-corrected clock; and a data output block suitable for outputting data outputted from an internal memory cell region, in synchronization with the internal clock signal.

In an embodiment, a method for operating a nonvolatile memory device suitable for sequentially performing a ZQ calibration operation and a read operation in response to a ZQ calibration enable signal and a read enable signal may include: entering a ZQ calibration operation period in response to the ZQ calibration enable signal; performing a duty correction operation in response to the read enable signal and setting a duty ratio, in the ZQ calibration operation period; being inputted with the read enable signal and outputting a duty-corrected clock based on the set duty ratio, in a read operation period; generating an internal clock signal in response to the duty-corrected clock; and outputting data outputted from an internal memory cell region, in synchronization with the internal clock signal.

In an embodiment, a method for operating a nonvolatile memory device suitable for sequentially performing a ZQ calibration operation and a read operation in response to a ZQ calibration enable signal and a read enable signal may include: entering a ZQ calibration operation period in response to the ZQ calibration enable signal; detecting a frequency of a memory system in response to the read enable signal and outputting a duty correction enable signal, and performing a duty correction operation in response to the duty correction enable signal and setting a duty ratio, in the ZQ calibration operation period; being inputted with the read enable signal and outputting a duty-corrected clock based on the set duty ratio, and outputting the read enable signal as an internal read enable signal, in a read operation period; being selectively inputted with the internal read enable signal or the duty-corrected clock in response to the duty correction enable signal, and generating an internal clock signal; and outputting data outputted from an internal memory cell region, in synchronization with the internal clock signal.

Since the nonvolatile memory device according to the embodiment performs a duty correction operation by using a ZQ calibration operation that is performed for impedance matching of a signal line between the nonvolatile memory device and a memory controller, it is possible to perform transmission of highly reliable data by using a minimal area.

Also, since the memory system according to the embodiment performs a duty correction operation only when a high-speed operation of the memory system is needed, it is possible to perform a low power operation.

DETAILED DESCRIPTION

Figure 1:
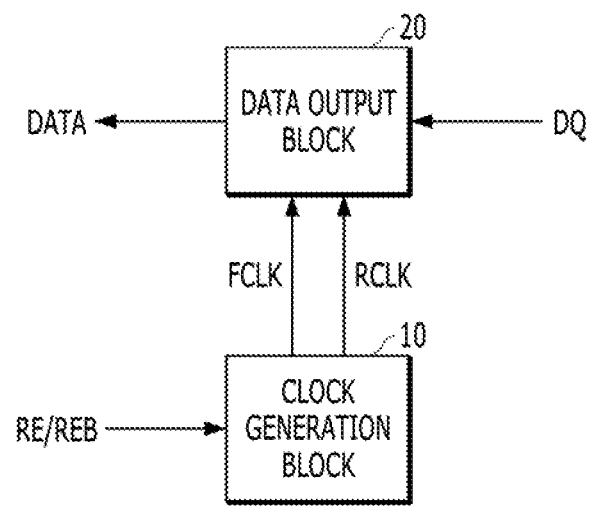
FIG. 1 is a block diagram illustrating a conventional flash memory device associated with a read interface.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete. Throughout the disclosure, like reference numerals refer to like parts throughout the various figures and embodiments of the present invention.

A semiconductor memory device may exchange commands and data to and from an external system, for example, a memory controller. It has been observed, that refection or distortion of data may occur if the Impedances of a bus line coupling the semiconductor memory device and the external system and of a signal line in the semiconductor memory device coupled with the bus line, do not match. To prevent data reflection or distortion, especially in a high speed semiconductor memory device, a configuration employing matching impedances may be employed. For example, a ZQ calibration operation may be used. A ZQ calibration operation may match an impedance of a data input/output circuit and an impedance of a signal line of a memory controller to prevent signal reflection or distortion caused by impedance mismatching due to a variation in operating conditions such as PVT variations i.e., process, voltage and temperature variations.

In various embodiments disclosed herein, a duty ratio correction operation for a read enable signal is performed by using a ZQ calibration operation performed for impedance matching of a signal line between a flash memory device and a memory controller, whereby it is possible to perform transmission of highly reliable data at high speed without increasing an additional area.

Figure 2:
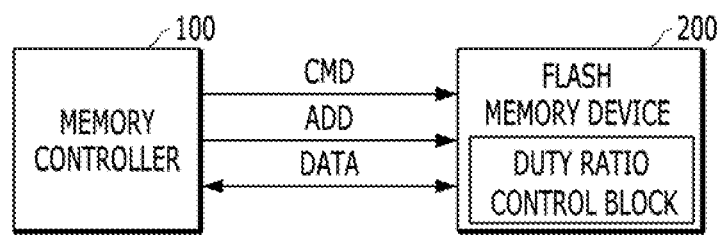
FIG. 2 is a block diagram illustrating a memory system, according to an embodiment of the present invention.

Referring to FIG. 2, the memory system according to an embodiment may include a memory controller 100 and a flash memory device 200 which may perform a specified operation in response to a command CMD and an address ADD inputted from the memory controller 100.

The command CMD may include a reset signal, a ZQ calibration signal ZQCAL_EN, a read enable signal RE, a write enable signal WEB, a command latch enable signal CLE, and a chip enable signal CEB. In the case where the command CMD is the reset signal, the flash memory device 200 may perform a reset operation. In the case where the command CMD is the ZQ calibration signal ZQCAL_EN, the flash memory device 200 may perform a ZQ calibration operation for impedance matching of a signal line. In the case where the command CMD is the read enable signal RE, the flash memory device 200 may perform a read operation of reading data from a memory cell region therein, corresponding to the inputted address ADD, and outputting data DATA. In the case where the command CMD is the write enable signal WEB, the flash memory device 200 may perform a write operation of receiving data DATA from the memory controller 100 and storing data in a memory cell region therein, corresponding to the inputted address ADD. The read enable signal RE is a clock signal which toggles in a preset cycle in a read operation period, and the write enable signal WEB is a clock signal which toggles in a preset cycle in a write operation period.

In an embodiment, the flash memory device 200 sequentially may perform the reset operation, the ZQ calibration operation and the read/write operation after power-on. During the period of the ZQ calibration operation, the memory controller 100 may output the read enable signal RE or the write enable signal WEB which toggles in the preset cycle, to the flash memory device 200, and the flash memory device 200 may perform a duty correction operation in response to the read enable signal RE or the write enable signal WEB. For example, the flash memory device 200 may include a duty ratio control block which may perform the duty correction operation in response to the read enable signal RE or the write enable signal WEB to set a duty ratio. Thereafter, during a read/write operation period, the flash memory device 200 may generate internal clock signals RCLK and FCLK based on the duty ratio set according to the duty correction operation, and output the data DATA in synchronization with the internal clock signals RCLK and FCLK.

Hereinafter, various embodiments of the invention will be described in relation to a read operation of a flash memory device. However, it is to be noted that the invention may also be realized with a write operation or other program operations. For example, a flash memory device may receive a write enable signal WEB which toggles during a ZQ calibration operation period before a write operation period, perform a duty correction operation for the write enable signal WEB to set in advance a duty ratio, generate internal clock signals FCLK and RCLK by using the duty ratio set in advance, in the write operation period, and receive data DATA inputted from a memory controller, in synchronization with the internal clock signals FCLK and RCLK. Also, while the described embodiments employ a flash memory device, it should be understood that the invention may also be implemented with other nonvolatile memory devices.

Figure 3A:
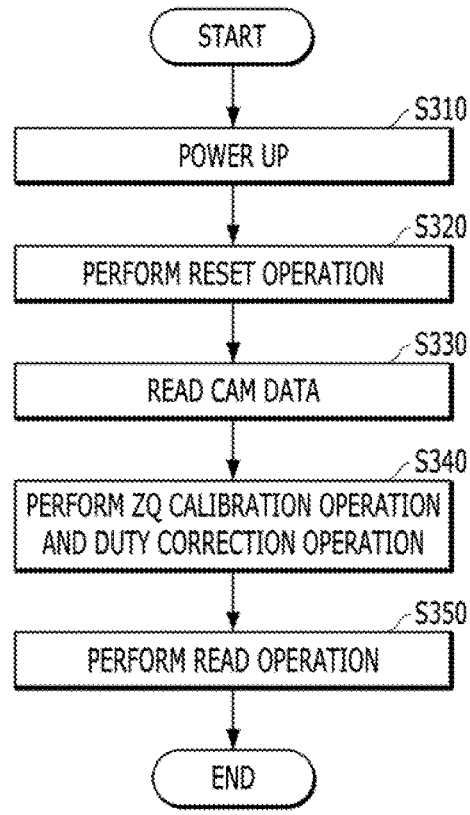
FIGS. 3A and 3B are a flow chart and a timing diagram explaining an operation of a memory system, according to an embodiment of the present invention.

Referring now to FIG. 3A, after power-up at step S310, the memory controller 100 of the memory system may apply the reset signal to the flash memory device 200, and the flash memory device 200 may perform the reset operation in response to the reset signal at step S320.

The memory controller 100 may then read out CAM (contents addressable memory) data stored in a memory cell region in the flash memory device 200 at step S330. For example, a nonvolatile memory device such as a flash memory may include CAM cells in addition to main memory cells, in a memory cell region, to store CAM data including column repair information, program information and internal logic configuration information. The memory controller may read the CAM data from the CAM cells when a reset signal is applied after power-up.

The memory system may perform a ZQ calibration operation for matching the impedance of a signal line between the memory controller 100 and the flash memory device 200 at step S340. For example, the memory controller 100 may transmit the ZQ calibration signal ZQCAL_EN to the flash memory device 200, and the flash memory device 200 may perform the ZQ calibration operation in response to the ZQ calibration signal ZQCAL_EN.

Then, the memory controller 100 may output the write enable signal WEB, the command latch enable signal CLE and the chip enable signal CEB to the flash memory device 200. The flash memory device 200 may enter the read operation period based on a combination of these signals. After a specified time, the memory controller 100 may transmit the read enable signal RE to the flash memory device 200. The flash memory device 200 may then perform the read operation in response to the read enable signal RE at step S350. The read enable signal RE is a clock signal which toggles at a preset cycle during a read operation period.

Figure 3B:
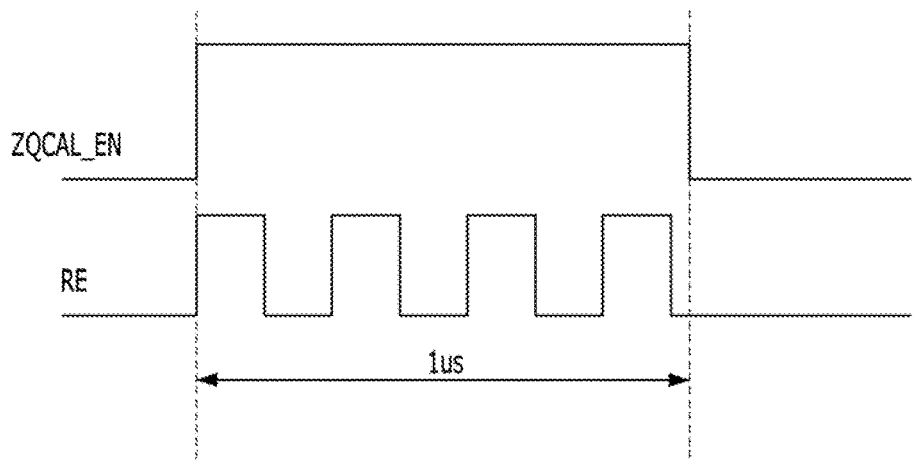

As illustrated in FIG. 3B, the memory controller 100 toggles and may output the read enable signal RE at a preset cycle, not only during a read operation period but also during the enable period of the ZQ calibration signal ZQCAL_EN, for example, during the ZQ calibration operation period of the step S340. Accordingly, the flash memory device 200 may perform the duty correction operation by using the read enable signal RE in the ZQ calibration operation period of the step S340. The ZQ calibration operation period may correspond to approximately 1 µs, and during this time, the flash memory device 200 may perform the duty correction operation in response to the read enable signal RE which toggles at a preset cycle, and set in advance the duty ratio of the read enable signal RE.

During a read operation period of step S350, the flash memory device 200 may generate the internal clock signals RCLK and FCLK in response to the read enable signal RE which toggles in the preset cycle. At this time, the flash memory device 200 may generate the Internal clock signals RCLK and FCLK according to the duty ratio set in advance according to the duty correction operation. The flash memory device 200 may then output the data DATA in synchronization with the internal clock signals RCLK and FCLK with corrected duty ratios.

Figure 4:
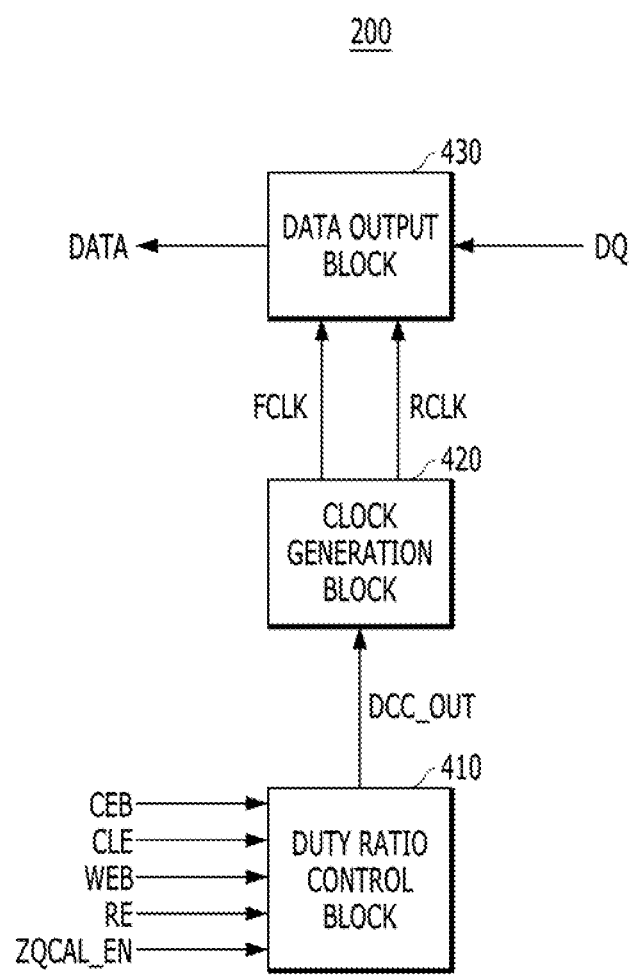
FIG. 4 is a block diagram illustrating a flash memory device, according to an embodiment of the present invention.

Referring now to FIG. 4, the flash memory device 200 may include a duty ratio control block 410, a clock generation block 420, and a data output block 430.

The duty ratio control block 410 may perform a duty correction operation in response to a read enable signal RE inputted from the memory controller 100 to set a duty ratio, in a ZQ calibration operation period. The duty ratio control block 410 may also output a duty-corrected clock DCC_OUT based on the set duty ratio in response to the read enable signal RE, during a read operation period. The read enable signal RE may toggle at a preset cycle. For example, the duty ratio control block 410 may perform the duty correction operation in response to the read enable signal RE which toggles at a preset cycle and set the duty ratio, when a ZQ calibration signal ZQCAL_EN is enabled. The duty ratio control block 410 may then correct the duty ratio of the read enable signal RE based on the set duty ratio, in response to the read enable signal RE which toggles at a preset cycle, and may output the duty-corrected clock DCC_OUT, during a read operation period. For example, the duty ratio control block 410 may enter the ZQ calibration operation period based on the ZQ calibration signal ZQCAL_EN which is inputted from the memory controller 100, and enter the read operation period based on a combination of a write enable signal WEB, a command latch enable signal CLE and a chip enable signal CEB, all of which are inputted from the memory controller 100.

The clock generation block 420 may generate internal clock signals RCLK and FCLK in response to the duty-corrected clock DCC_OUT. The internal clock signals RCLK and FCLK may include a rising clock RCLK and a falling clock FCLK. The clock generation block 420 may generate the rising clock RCLK and the falling clock FCLK which may be enabled at the rising edge and the falling edge of the duty-corrected clock DCC_OUT, respectively.

The data output block 430 may output data DQ from a memory cell region (not shown) of the flash memory device 200, as external data DATA to the memory controller 100, in synchronization with the internal clock signals RCLK and FCLK.

The flash memory device 200 may receive the read enable signal RE, during the ZQ calibration operation period before the read operation period, perform the duty correction operation for the read enable signal RE, and set in advance a duty ratio. Accordingly, when the read enable signal RE is inputted during a subsequent read operation period, the duty ratio of the read enable signal RE may be corrected by using the duty ratio set in advance. Also, the internal clock signals RCLK and FCLK may be generated based on the corrected duty ratio. As a result, data at a high speed may be transmitted reliably.

Figure 5:
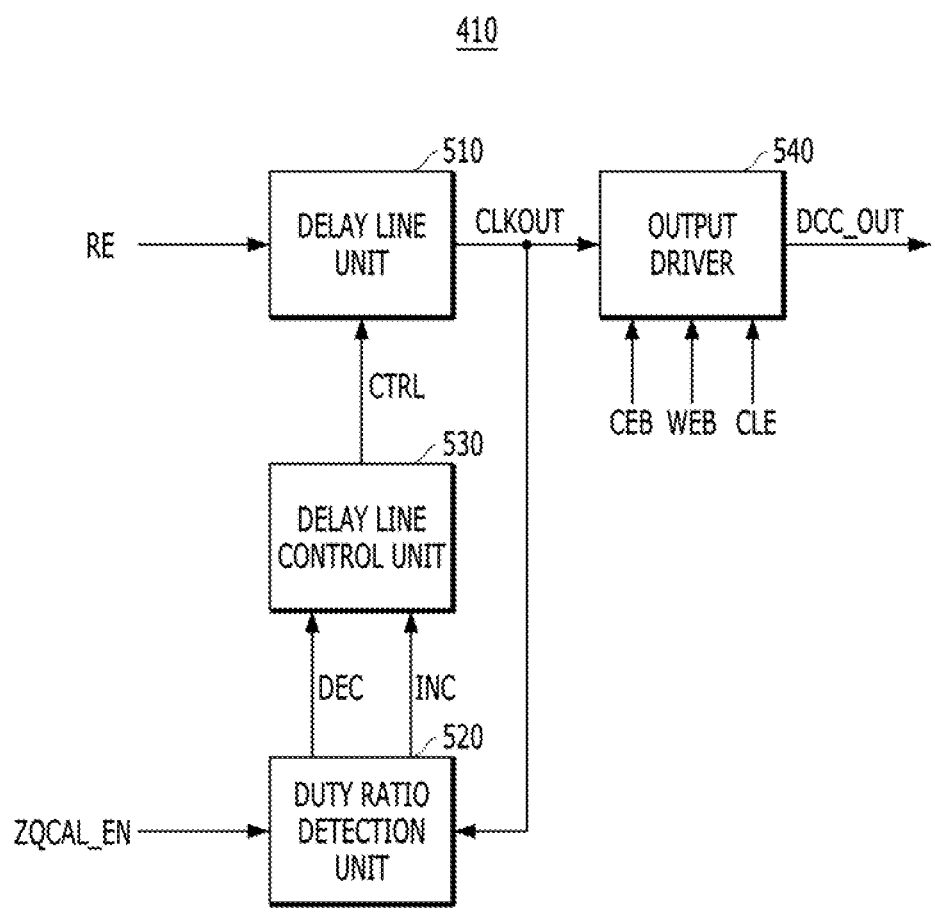
FIG. 5 is a block diagram illustrating an example of duty ratio control block, according to an embodiment of the present invention.

Referring now to FIG. 5, the duty ratio control block 410 may include a delay line unit 510, a duty ratio detection unit 520, a delay line control unit 530, and an output driver 540.

The delay line unit 510 may delay the read enable signal RE by a preset time in response to a delay line control signal CTRL, and may output a delayed clock CLKOUT. The duty ratio detection unit 520, which may be enabled during the ZQ calibration operation period, detect the duty ratio of the delayed clock CLKOUT, and output detection signals INC and DEC. The delay line control unit 530 may output the delay line control signal CTRL in response to the detection signals INC and DEC. The output driver 540 may output the delayed clock CLKOUT as the duty-corrected clock DCC_OUT.

For example, the duty ratio detection unit 520 may detect the duty ratio of the delayed clock CLKOUT when the ZQ calibration signal ZQCAL_EN is enabled, and may output the detection signals INC and DEC. In an embodiment, the detection signals INC and DEC may include an increase signal INC and a decrease signal DEC. When a target duty ratio is set to 50:50, the decrease signal DEC may be enabled in the case where the duty ratio of the delayed clock CLKOUT is larger than the target duty ratio. The increase signal INC may also be enabled in the case where the duty ratio of the delayed clock CLKOUT is smaller than the target duty ratio.

The delay line control unit 530 may adjust and output the delay line control signal CTRL in response to the increased signal INC and the decrease signal DEC. In an embodiment, the delay line control signal CTRL may be configured by a plurality of codes C<0:15>. For example, as initial values of the plurality of codes C<0:15>, some codes C<0:7> may be set to a high level, and the remaining codes C<8:15> may be set to a low level.

The delay line unit 510 may correct the duty ratio of the read enable signal RE in response to the delay line control signal CTRL, and generate the delayed clock CLKOUT.

When the duty ratio reaches a target range the duty ratio at that time is set in the delay line unit 510. Operations of the duty ratio detection unit 520, the delay line control unit 530 and the delay line unit 510 may be iterated as many times as necessary to reach a target range for the duty ratio.

The output driver 540 may be enabled during a read operation period, and may output the delayed clock CLKOUT as the duty-corrected clock DCC_OUT during the read operation period. The output driver 540 may be enabled during the read operation period, based on a combination of the write enable signal WEB, the command latch enable signal CLE and the chip enable signal CEB.

Hereafter, another example of a flash memory device will be described with reference to FIG. 6. The flash memory device 200 may correct a duty ratio by feeding back internal clock signals RCLK and FCLK generated therein, instead of correcting the duty ratio of a read enable signal RE. The flash memory device 200 may include a duty ratio control block 610, a clock generation block 620, and a data output block 630.

The duty ratio control block 610 may perform a duty correction operation in response to first and second read enable signals RE and REB inputted from the memory controller 100 and internal clock signals RCLK and FCLK and set a duty ratio, during a ZQ calibration operation period. The duty ratio control block 610 may output a duty-corrected clock DCC_OUT based on the set duty ratio, in response to the first and second read enable signals RE and REB, during a read operation period. The first and second read enable signals RE and REB may toggle at a preset cycle. The duty ratio control block 610 may receive the first and second read enable signals RE and REB, at an initial period of the ZQ calibration operation period during which a ZQ calibration signal ZQCAL_EN is enabled, and may output them as the duty-corrected clock DCC_OUT. The duty ratio control block 610 may feedback the internal clock signals RCLK and FCLK from the clock generation block 620, during a remaining period following the initial period of the ZQ calibration operation period. The duty ratio control block 610 may perform a duty correction operation, and set a corrected duty ratio during the remaining period following the initial period of the ZQ calibration operation period Thereafter, during a read operation period, the duty ratio control block 610 may then correct the duty ratio of the first and second read enable signals RE and REB based on the set duty ratio, and may output the duty-corrected clock DCC_OUT. For example, the duty ratio control block 610 may enter the ZQ calibration operation period based on the ZQ calibration signal ZQCAL_EN inputted from the memory controller 100, and enter the read operation period based on a combination of a write enable signal WEB, a command latch enable signal CLE and a chip enable signal CEB, all of which are inputted from the memory controller 100.

The clock generation block 620 may generate the internal clock signals RCLK and FCLK in response to the duty-corrected clock DCC_OUT. The internal clock signals RCLK and FCLK may include a rising clock RCLK and a falling clock FCLK. The clock generation block 620 may generate the rising clock RCLK and the falling clock FCLK enabled at the rising edge and the falling edge of the duty-corrected clock DCC_OUT, respectively.

The data output block 630 may output data DQ outputted from a memory cell region (not shown) of the flash memory device 200, as external data DATA to the memory controller 100, in synchronization with the internal clock signals RCLK and FCLK.

As described above, according to an embodiment, the flash memory device 200 may be inputted with the read enable signals RE and REB which toggle in the ZQ calibration operation period before the read operation period, generate the internal clock signals RCLK and FCLK, perform the duty correction operation for the generated internal clock signals RCLK and FCLK, and set in advance a duty ratio. Therefore, the correction of a duty ratio by feeding back the internal clock signals RCLK and FCLK which are generated in the flash memory device 200, makes it possible to compensate for a duty ratio of a clock that is distorted in the flash memory device 200.

Figure 6:
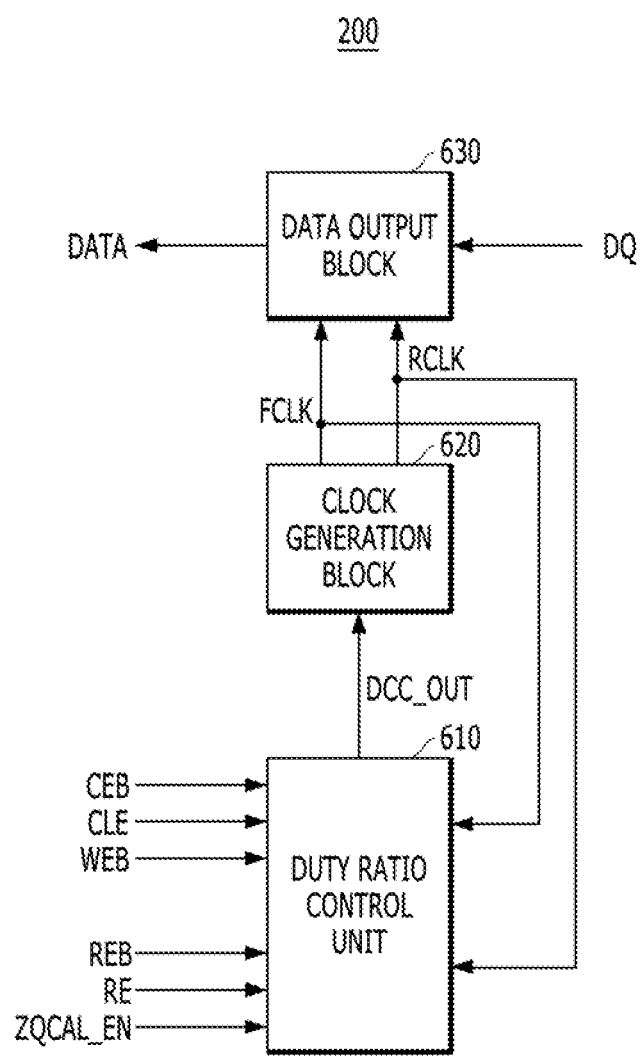
FIG. 6 is a block diagram illustrating a flash memory device, according to another embodiment of the present invention.
Figure 7:
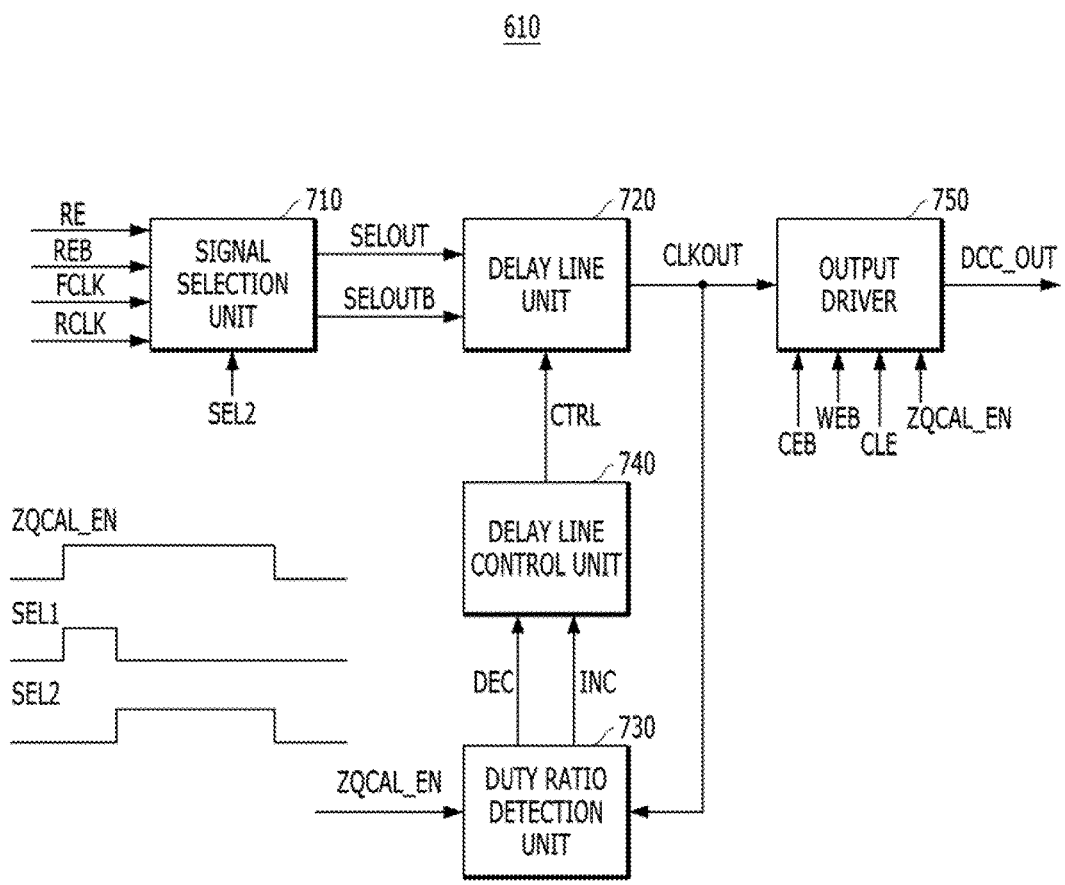
FIG. 7 is a block diagram illustrating another example of a duty ratio control block, according to an embodiment of the present invention.

FIG. 7 is a more detailed block diagram illustrating the duty ratio control block 610 shown in FIG. 6.

Referring to FIG. 7, the duty ratio control block 610 may include a signal selection unit 710, a delay line unit 720, a duty ratio detection unit 730, a delay line control unit 740, and an output driver 750.

Since the delay line unit 720, the duty ratio detection unit 730 and the delay line control unit 740 of FIG. 7 have substantially the same configurations as the delay line unit 510, the duty ratio detection unit 520 and the delay line control unit 530 of the duty ratio control block 410 of FIG. 5, detailed descriptions thereof will not be repeated.

The signal selection unit 710 may select the first and second read enable signals RE and REB or the rising clock RCLK and the falling clock FCLK in response to a select signal SEL2, and may output first and second selected output signals SELOUT and SELOUTB. For example, the select signal SEL2 may define the Initial period of the ZQ calibration operation period. The select signal SEL2 may be enabled during the remaining period following the initial period of the ZQ calibration operation period. Accordingly, the signal selection unit 710 may select and output the rising clock RCLK and the falling clock FCLK during the remaining period following the initial period of the ZQ calibration operation period, during which the select signal SEL2 may be enabled. Although not shown in the drawing, a signal generation unit for receiving the ZQ calibration signal ZQCAL_EN and generating the select signal SEL2 may be additionally provided.

The output driver 750 may be enabled during the ZQ calibration operation period and the read operation period, and output the delayed clock CLKOUT as the duty-corrected clock DCC_OUT. The output driver 750 may be enabled during the ZQ calibration operation period in response to the ZQ calibration signal ZQCAL_EN. The output driver 750 may also be enabled during a read operation period, based on a combination of the write enable signal WEB, the command latch enable signal CLE and the chip enable signal CEB.

Hereinbelow, operations of the flash memory device 200 and the duty ratio control block 610 will be described with reference to FIGS. 6 to 8.

Figure 8:
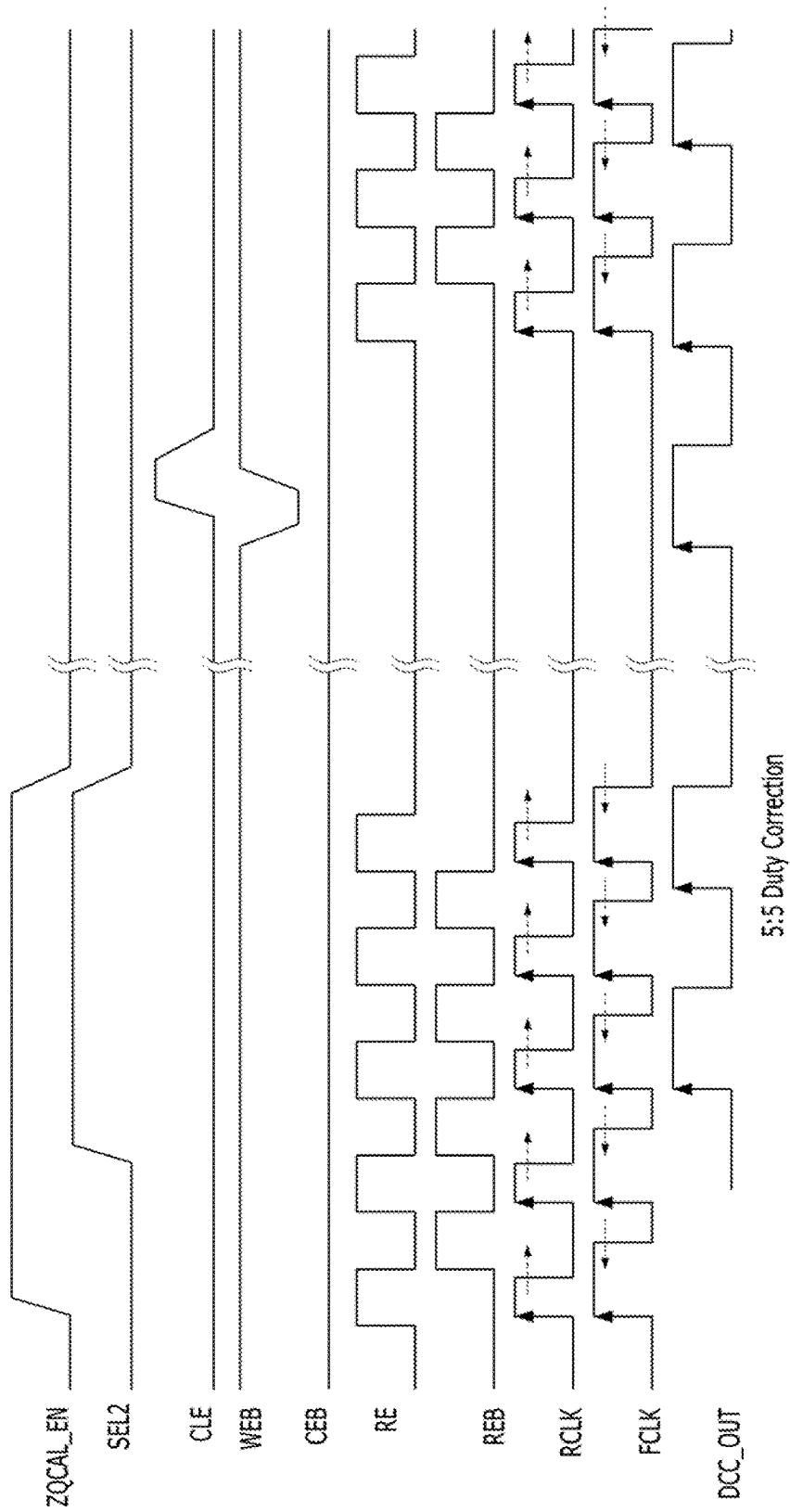
FIG. 8 is a timing diagram explaining an operation of a flash memory device as shown in FIGS. 6 and 7, according to an embodiment of the present invention.

FIG. 8 is a timing diagram illustrating an operation of the flash memory device 200 shown in FIGS. 6 and 7.

Referring to FIG. 8, if the ZQ calibration signal ZQCAL_EN is enabled, the ZQ calibration operation period may be entered.

The select signal SEL2 may be disabled during the initial period of the ZQ calibration operation period. The signal selection unit 710 may then select the first and second read enable signals RE and REB and may output the first and second selected output signals SELOUT and SELOUTB. The delay line unit 720 may delay the first and second selected output signals SELOUT and SELOUTB by a default delay value, and may output the delayed clock CLKOUT. The default delay value may be zero or some other reference value. The output driver 750 may output the delayed clock CLKOUT as the duty-corrected clock DCC_OUT in response to the ZQ calibration signal ZQCAL_EN. Thereafter, the clock generation block 620 may generate the rising clock RCLK and the falling clock FCLK in response to the duty-corrected clock DCC_OUT.

The select signal SEL2 may be enabled in the remaining period following the initial period of the ZQ calibration operation period, and according to this the signal selection unit 710 may select the rising clock RCLK and the falling clock FCLK fed back from the clock generation block 620 and may output the first and second selected output signals SELOUT and SELOUTB. The delay line unit 720 may delay the first and second selected output signals SELOUT and SELOUTB by a preset time in response to a delay line control signal CTRL, and may output the delayed clock CLKOUT. The duty ratio detection unit 730 may be enabled during the ZQ calibration operation period to detect the duty ratio of the delayed clock CLKOUT, and may output detection signals INC and DEC. The delay line control unit 740 may output the delay line control signal CTRL in response to the detection signals INC and DEC. When the duty ratio reaches a target range duty ratio as operations of the duty ratio detection unit 730, the delay line control unit 740 and the delay line unit 720 are repeatedly performed, a duty ratio at that time is set in the delay line unit 720.

Thereafter, a read operation period is entered in response to a combination of the write enable signal WEB, the command latch enable signal CLE and the chip enable signal CEB, and after a preselected time, the first and second read enable signals RE and REB may be inputted.

The select signal SEL2 may be disabled during a read operation period, and according to this the signal selection unit 710 may select the first and second read enable signals RE and REB and may output the first and second selected output signals SELOUT and SELOUTB. The delay line unit 720 may receive the first and second selected output signals SELOUT and SELOUTB, and may output the delayed clock CLKOUT based on the set duty ratio. The output driver 750 may be enabled in response to a combination of the write enable signal WEB, the command latch enable signal CLE and the chip enable signal CEB, and output the delayed clock CLKOUT as the duty-corrected clock DCC_OUT. Thereafter, the clock generation block 620 may generate the rising clock RCLK and the falling clock FCLK with corrected duty ratios, in response to the duty-corrected clock DCC_OUT.

Hereafter, a flash memory device 200 according to yet another embodiment, will be described with reference to FIG. 9. The flash memory device 200 shown in FIG. 9 may detect a frequency of a memory system in response to a read enable signal RE, and selectively perform a duty correction operation according to whether the detected frequency is a high frequency or a low frequency.

The flash memory device 200 may include a frequency detection block 810, a duty ratio control block 820, a low-speed operation determination block 830, a clock generation block 840, and a data output block 850.

The frequency detection block 810 may receive a read enable signal RE, detect a frequency of a memory system and output a duty correction enable signal EN, during a ZQ calibration operation period. The read enable signal RE may toggle at a preset cycle. The frequency detection block 810 may detect a frequency of the read enable signal RE to determine whether the memory system is operating at a high speed. The frequency detection block 810 may enable the duty correction enable signal EN, when the detected frequency is higher than a preset reference value. The frequency detection block 810 may determine whether the memory system is operating at a low speed and disable the duty correction enable signal EN, when the detected frequency is equal to or lower than the preset reference value.

The duty ratio control block 820 may receive first and second read enable signals RE and REB which are inputted from the memory controller 100 and internal clock signals RCLK and FCLK, may perform a duty correction operation, to set a duty ratio, in response to the duty correction enable signal EN. Also, during the read operation period, the duty ratio control block 820 may receive the first and second read enable signals RE and REB, and output a duty-corrected clock DCC_OUT based on the set duty ratio. The duty ratio control block 820 may receive the first and second read enable signals RE and REB which toggle at a preset cycle, during an initial period of the ZQ calibration operation period during which a ZQ calibration signal ZQCAL_EN is enabled, and may output them as the duty-corrected clock DCC_OUT. The duty ratio control block 820 may feedback the internal clock signals RCLK and FCLK from the clock generation block 840, during a remaining period following the initial period of the ZQ calibration operation period. The duty ratio control block 820 may perform a duty correction operation to set a duty ratio during a remaining period following the initial period of the ZQ calibration operation period. Thereafter, during the read operation period, the duty ratio control block 820 may then correct the duty ratio of the first and second read enable signals RE and REB based on the set duty ratio, and may output the duty-corrected clock DCC_OUT. The duty ratio control block 820 of FIG. 9 has substantially the same configuration as the duty ratio control block 610 of FIG. 7 except that it may receive the duty correction enable signal EN instead of the ZQ calibration signal ZQCAL_EN, and therefore, a detailed description thereof will not be repeated.

The low-speed operation determination block 830 may be disabled in response to the duty correction enable signal EN. The low-speed operation determination block 830 may receive the read enable signal RE and may output an internal read enable signal REI.

The clock generation block 840 may select the duty-corrected clock DCC_OUT outputted from the duty ratio control block 820 or the Internal read enable signal REI outputted from the low-speed operation determination block 830, in response to the duty correction enable signal EN, and may generate the internal clock signals RCLK and FCLK in response to a selected signal. The clock generation block 840 may include a clock selection unit 842 which may select the duty-corrected clock DCC_OUT when the duty correction enable signal EN may be enabled and may select the internal read enable signal REI when the duty correction enable signal EN is disabled. For example, the internal clock signals RCLK and FCLK may include a rising clock RCLK and a falling clock FCLK. The clock generation block 840 may generate the rising clock RCLK and the falling clock FCLK which are enabled at the rising edge and the falling edge, respectively, of the duty-corrected clock DCC_OUT.

The data output block 850 may output data DQ from a memory cell region (not shown) of the flash memory device 200, as external data DATA, to the memory controller 100 in synchronization with the internal clock signals RCLK and FCLK.

The flash memory device 200, according to an embodiment, may receive the read enable signals RE and REB which toggle in the ZQ calibration operation period before the read operation period, generate the internal clock signals RCLK and FCLK and perform the duty correction operation for the generated internal clock signals RCLK and FCLK to set in advance a duty ratio. Therefore, correcting a duty ratio by feeding back the internal clock signals RCLK and FCLK which are generated in the flash memory device 200, may allow to compensate for a duty ratio of a clock that is distorted in the flash memory device 200.

Also, since the flash memory device 200 according to an embodiment, may detect a frequency of a memory system and may perform a duty correction operation only when a high-speed operation of the memory system is needed, it is possible to perform a low power operation.

Figure 9:
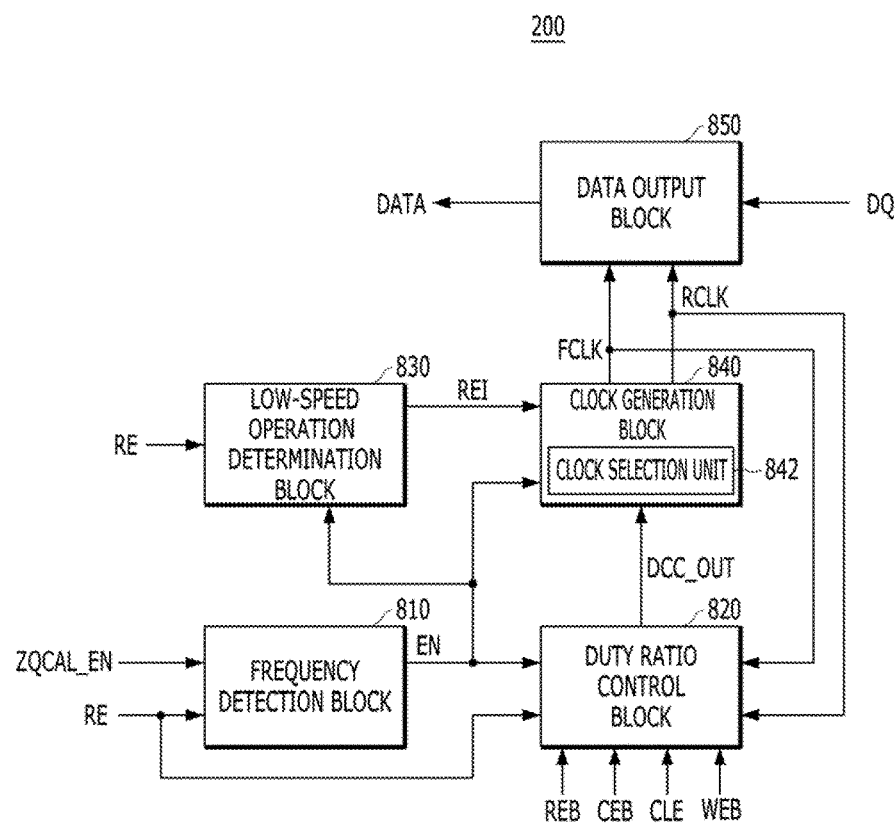
FIG. 9 is a block diagram illustrating a flash memory device, according to yet another embodiment of the present invention.
Figure 10:
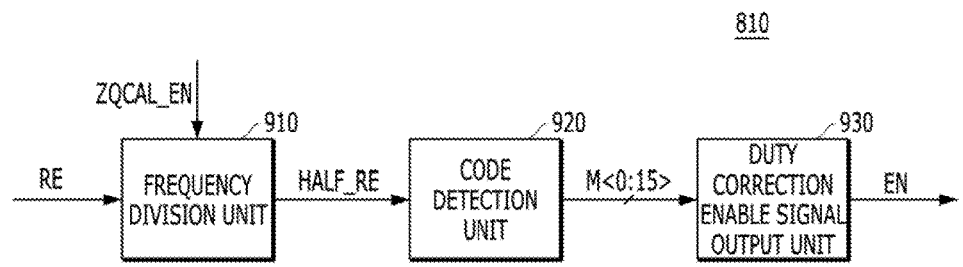
FIG. 10 is a block diagram illustrating an example frequency detection block as shown in FIG. 9, according to an embodiment of the present invention.

FIG. 10 is a detailed block diagram illustrating the frequency detection block 810 shown in FIG. 9.

Referring to FIG. 10, the frequency detection block 810 may include a frequency division unit 910, a code detection unit 920, and a duty correction enable signal output unit 930.

The frequency division unit 910 may divide a frequency of the read enable signal RE which is inputted in the ZQ calibration operation period, by a preset number. In an embodiment, the preset number may be two, however any other suitable dividing of the frequency of the read enable signal may be performed. For example, the frequency division unit 910 may divide by two a frequency of the inputted read enable signal RE, and generate a frequency-divided clock signal HALF_RE with a one half of the frequency of the inputted read enable signal RE. Or also as an example the frequency division unit 910 may divide by three or four a frequency of the inputted read enable signal RE, and generate a frequency-divided clock signal with a one third or one fourth of the frequency of the inputted read enable signal respectively.

The code detection unit 920 may receive the frequency-divided clock signal, for example, the one half signal HALF_RE, detect a level of the frequency-divided clock signal HALF_RE at a preset number of times, and output digital codes M<0:15>. In an embodiment, the preset number of times may be 16 times, and the code detection unit 920 may output the digital codes M<0:15> corresponding to the 16 times.

The duty correction enable signal output unit 930 may receive the digital codes M<0:15>, and determines and output whether to enable the duty correction enable signal EN. For example, in the case where the number of periods in which the digital codes M<0:15> are changed from a high level to a low level is larger than a preselected reference, the duty correction enable signal output unit 930 may enable and output the duty correction enable signal EN. In the case where the number of periods in which the digital codes M<0:15> are changed from the high level to the low level is equal to or smaller than the preselected reference, the duty correction enable signal output unit 930 may be disabled and may output the duty correction enable signal EN.

Figure 11A:
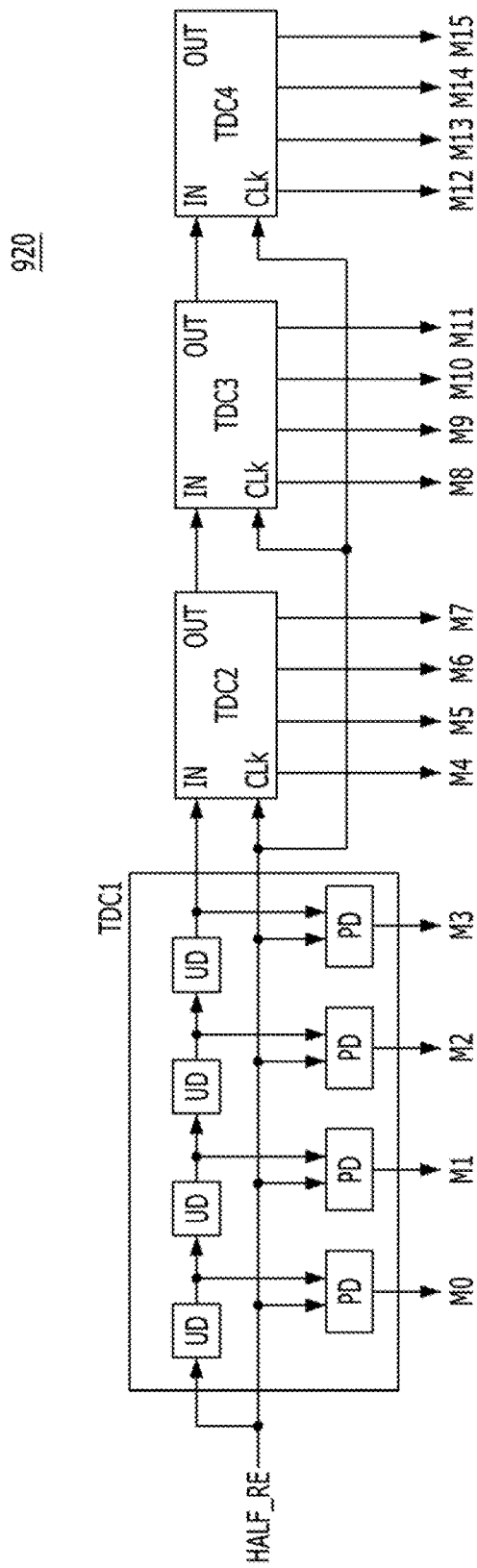
FIGS. 11A and 11B are circuit and operation waveform diagrams illustrating an example of a code detection unit as shown in FIG. 10, according to an embodiment of the present invention.
Figure 11B:
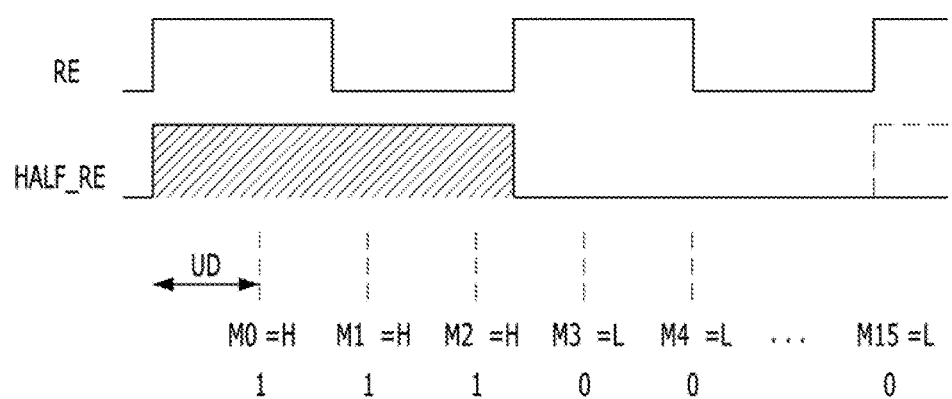

FIGS. 11A and 11B are a detailed circuit diagram and an operation waveform diagram illustrating the code detection unit 920 shown in FIG. 10.

Referring to FIG. 11A, the code detection unit 920 may include a plurality of time delay circuits TDC which are coupled in series with each other. In an embodiment, the code detection unit 920 may include first to fourth time delay circuits TDC1 to TDC4, and the respective time delay circuits TDC1 to TDC4 may generate corresponding digital codes M<0:3>, M<4:7>, M<8:11> and M<12:15>.

Since the second to fourth time delay circuits TDC2 to TDC4 have substantially the same configuration as the first time delay circuit TDC1, the following descriptions will be made only for the first time delay circuit TDC1, as an example, to avoid unnecessary repetition.

The first time delay circuit TDC1 may include a plurality of unit delay sections UD and comparison sections PD which one-to-one correspond to codes. In an embodiment, the first time delay circuit TDC1 may include four unit delay sections UD and 4 comparison sections PD which correspond to the four codes M<0:3>. The respective unit delay sections UD may be coupled in series, delay signals may be inputted thereto by a unit time, and may output resultant signals. The respective comparison sections PD compare the outputs of corresponding unit delay sections UD with a phase of the frequency-divided clock signal HALF_RE, and output comparison results as digital codes.

As a result, the first to fourth time delay circuits TDC1 to TDC4 may convert digital values representing the high level periods and the low level periods of the frequency-divided clock signal HALF_RE, into the digital codes M<0:15>, and output the digital codes M<0:15>.

Referring to FIG. 11B, an example is shown where digital values representing high level and low level periods of the frequency-divided clock signal HALF_RE are denoted with "11100 . . . 0." In the case where the number of periods in which the digital codes M<0:15> are changed from the high level to the low level is larger than the preselected reference, the duty correction enable signal output unit 930 may enable and output the duty correction enable signal EN.

Figure 12:
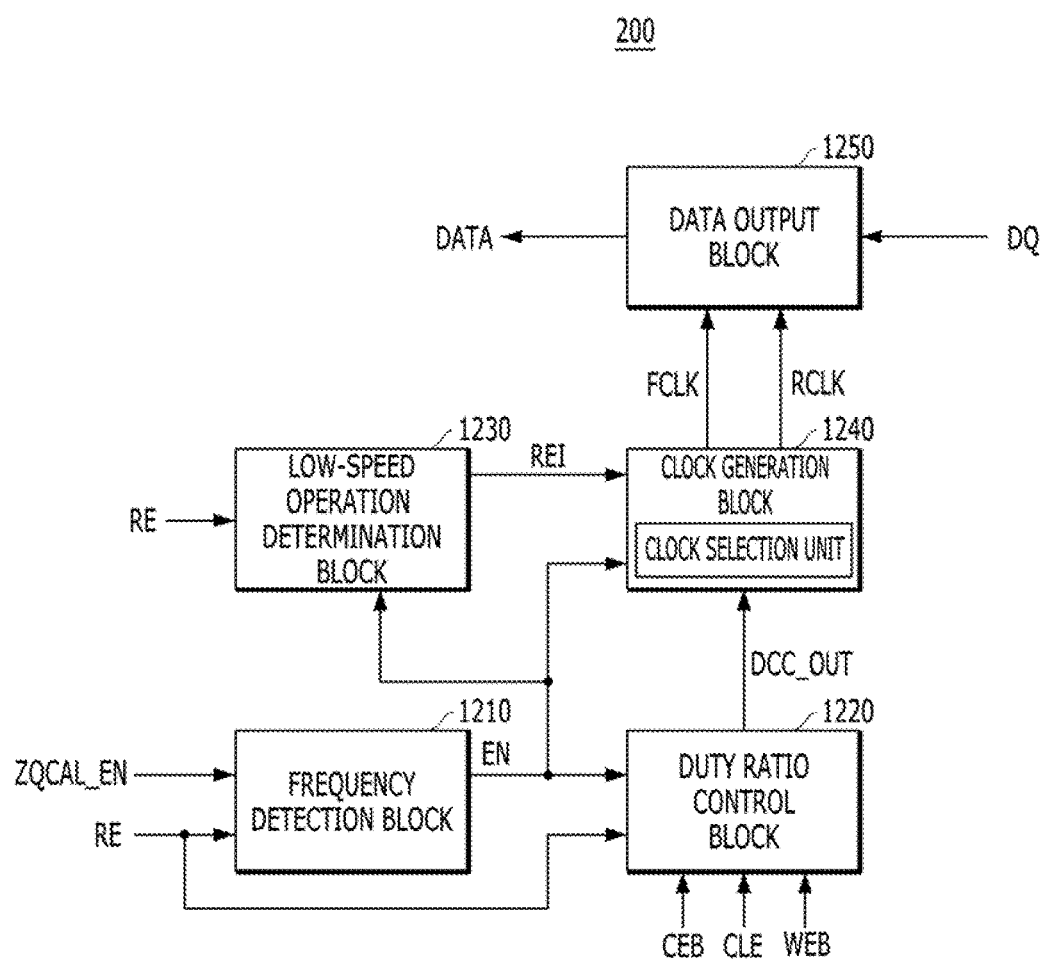
FIG. 12 is a block diagram illustrating a flash memory device, according to yet another embodiment of the present invention.

Although the flash memory device 200 shown in FIG. 9 illustrates a scheme in which a duty ratio is corrected by feeding back the internal clock signals RCLK and FCLK, it is to be noted that a duty ratio may be corrected by using only a read enable signal RE as shown in FIG. 12, without feeding back the internal clock signals RCLK and FCLK.

Referring now to FIG. 12, the flash memory device 200 may include a frequency detection block 1210, a duty ratio control block 1220, a low-speed operation determination block 1230, a clock generation block 1240, and a data output block 1250.

The frequency detection block 1210, the low-speed operation determination block 1230, the clock generation block 1240 and the data output block 1250 of FIG. 12 have substantially the same configurations as the frequency detection block 810, the low-speed operation determination block 830, the clock generation block 840 and the data output block 850 of FIG. 9. Hence detailed descriptions thereof will not be repeated. Also, the duty ratio control block 1220 of FIG. 12 has substantially the same configuration as the duty ratio control block 410 of FIG. 5 except that it receives a duty correction enable signal EN instead of a ZQ calibration signal ZQCAL_EN, and therefore, a detailed description thereof will be omitted herein.

As discussed above, the flash memory device 200, according to an embodiment, may receive a read enable signal RE, may perform a duty correction operation for the read enable signal RE to set in advance a duty ratio, during a ZQ calibration operation period before a read operation period. Subsequently, the flash memory device 200 may generate internal clock signals RCLK and FCLK by using the duty ratio set in advance, during a read operation period, whereby it is possible to transmit reliable data at a high speed.

Moreover, the flash memory device 200 according to an embodiment, may feedback the Internal clock signals RCLK and FCLK, perform a duty correction operation for the internal clock signals RCLK and FCLK to set in advance a duty ratio, in the ZQ calibration operation period before the read operation period. Subsequently, the flash memory device 200 may generate the internal clock signals RCLK and FCLK by using the duty ratio set in advance, during a read operation period, whereby it is possible to compensate for a duty ratio of a clock that is distorted in the flash memory device 200.

In addition, since the flash memory device 200, according to an embodiment, may detect a frequency of a memory system and perform a duty correction operation only when a high-speed operation of the memory system is needed, it is possible to perform a low power operation.

Although various embodiments have been described for illustrative purposes, it will be apparent to those skilled in the art that various changes and modifications may be made without departing from the spirit and scope of the invention as defined in the following claims.

For example, while it was described in the embodiments that the flash memory device may receive a read enable signal which toggles, during a ZQ calibration operation period before a read operation period, and may perform a duty correction operation for the read enable signal, it is to be noted that a flash memory device may receive a write enable signal which toggles, during a ZQ calibration operation period before a write operation period, set in advance a duty ratio by performing a duty correction operation for the write enable signal and generate internal clock signals FCLK and RCLK by using the duty ratio set in advance.

What is claimed is:

1. A memory system comprising:
 a memory controller; and
 a nonvolatile memory device suitable for performing a specified operation in response to a command inputted from the memory controller;
 wherein the nonvolatile memory device sequentially performs a ZQ calibration operation for impedance matching of a signal line between the memory controller and the nonvolatile memory device and a read operation in response to a ZQ calibration enable signal and a read enable signal inputted from the memory controller;
 wherein during a ZQ calibration operation period, the memory controller outputs the read enable signal to the nonvolatile memory device, and the nonvolatile memory device performs a duty correction operation in response to the read enable signal and sets a duty ratio; and
 wherein during a read operation period, the nonvolatile memory device generates an internal clock signal based on the set duty ratio, and outputs data in synchronization with the internal clock signal.

2. The memory system according to claim 1, wherein the nonvolatile memory device comprises:
 a duty ratio control block suitable for receiving the read enable signal, performing the duty correction operation and setting the duty ratio, during the ZQ calibration operation period, and receiving the read enable signal and outputting a duty-corrected clock based on the set duty ratio, during a read operation period;
 a clock generation block suitable for generating the internal clock signal in response to the duty-corrected clock; and
 a data output block suitable for outputting data outputted from an internal memory cell region, in synchronization with the internal clock signal.

3. The memory system according to claim 2, wherein the duty ratio control block comprises:
 a delay line unit suitable for delaying the read enable signal by a preset time in response to a delay line control signal, and outputting a delayed clock;
 a duty ratio detection unit suitable for detecting a duty ratio of the delayed clock and outputting detection signals, during the ZQ calibration operation period;
 a delay line control unit suitable for outputting the delay line control signal in response to the detection signals; and
 an output driver suitable for outputting the delayed clock as the duty-corrected clock during a read operation period.

4. The memory system according to claim 1, wherein the nonvolatile memory device comprises:
 a duty ratio control block suitable for receiving the read enable signal and the internal clock signal, performing the duty correction operation and setting the duty ratio, in the ZQ calibration operation period, and receiving the read enable signal and outputting a duty-corrected clock based on the set duty ratio, during a read operation period;

a clock generation block suitable for generating the internal clock signal in response to the duty-corrected clock; and a data output block suitable for outputting data outputted from an internal memory cell region, in synchronization with the internal clock signal.

5. The memory system according to claim 4, wherein the duty ratio control block comprises:

a signal selection unit suitable for selecting and outputting the read enable signal or the internal clock signal in response to a select signal which defines an initial period of the ZQ calibration operation period;

a delay line unit suitable for delaying an output signal of the signal selection unit by a preset time in response to a delay line control signal, and outputting a delayed clock;

a duty ratio detection unit suitable for detecting a duty ratio of the delayed clock and outputting detection signals, in the ZQ calibration operation period;

a delay line control unit suitable for outputting the delay line control signal in response to the detection signals; and an output driver suitable for outputting the delayed clock as the duty-corrected clock during a read operation period and the ZQ calibration operation period.

6. The memory system according to claim 5, wherein the select signal is enabled in a remaining period, following the initial period, of the ZQ calibration operation period, and wherein the signal selection unit selects the internal clock signal when the select signal is enabled, and selects the read enable signal when the select signal is disabled.

7. The memory system according to claim 1, wherein the nonvolatile memory device comprises:

a frequency detection block suitable for receiving the read enable signal, detecting a frequency of the memory system and outputting a duty correction enable signal, during the ZQ calibration operation period;

a duty ratio control block suitable for receiving the read enable signal and the internal clock signal, performing the duty correction operation and setting the duty ratio, in response to the duty correction enable signal, and receiving the read enable signal and outputting a duty-corrected clock based on the set duty ratio, during a read operation period;

a low-speed operation determination block suitable for being disabled in response to the duty correction enable signal, and receiving the read enable signal and outputting an internal read enable signal;

a clock generation block suitable for generating the internal clock signal in response to the duty-corrected clock or the internal read enable signal; and a data output block suitable for outputting data outputted from an internal memory cell region, in synchronization with the internal clock signal.

8. The memory system according to claim 7, wherein the frequency detection block enables the duty correction enable signal when the frequency of the memory system is a high frequency, and disables the duty correction enable signal when the frequency of the memory system is a low frequency.

9. The memory system according to claim 7, wherein the clock generation block selects the duty-corrected clock when the duty correction enable signal is enabled, and selects the internal read enable signal when the duty correction enable signal is disabled.

10. The memory system according to claim 7, wherein the frequency detection block comprises:

a frequency division unit suitable for dividing a frequency of the read enable signal which is inputted in the ZQ calibration operation period, by a preset number, and outputting a frequency-divided clock signal;

a code detection unit suitable for receiving the frequency-divided clock signal, detecting a level of the frequency-divided clock signal at a preset number of times, and outputting a plurality of digital codes; and a duty correction enable signal output unit suitable for determining and outputting whether to enable the duty correction enable signal, based on the plurality of digital codes.

11. The memory system according to claim 10, wherein the code detection unit comprises a plurality of time delay circuits which are coupled in series with each other, and wherein each time delay circuit comprises:

a plurality of unit delay sections coupled in series, suitable for delaying signals inputted thereto, by a unit time, and outputting resultant signals; and a plurality of comparison sections suitable for comparing outputs of the corresponding unit delay sections with a phase of the frequency-divided clock signal, and outputting comparison results as corresponding digital codes.

12. The memory system according to claim 1, wherein, in the ZQ calibration operation period, the read enable signal toggles during an enable period of the ZQ calibration enable signal.

13. A nonvolatile memory device suitable for sequentially performing a ZQ calibration operation for impedance matching of a signal line between an external device and the nonvolatile memory device and a read operation in response to a ZQ calibration enable signal and a read enable signal, the nonvolatile memory device comprising:

a duty ratio control block suitable for receiving the read enable signal, performing a duty correction operation and setting a duty ratio, in a ZQ calibration operation period, and receiving the read enable signal and outputting a duty-corrected clock based on the set duty ratio, in a read operation period;

a clock generation block suitable for generating an internal clock signal in response to the duty-corrected clock; and a data output block suitable for outputting data outputted from an internal memory cell region, in synchronization with the internal clock signal.

14. The nonvolatile memory device according to claim 13, wherein, in the ZQ calibration operation period, the read enable signal toggles during an enable period of the ZQ calibration enable signal.

15. The nonvolatile memory device according to claim 13, wherein the duty ratio control block comprises:

a delay line unit suitable for delaying the read enable signal by a preset time in response to a delay line control signal, and outputting a delayed clock;

a duty ratio detection unit suitable for detecting a duty ratio of the delayed clock and outputting detection signals, in the ZQ calibration operation period;

a delay line control unit suitable for outputting the delay line control signal in response to the detection signals; and an output driver suitable for outputting the delayed clock as the duty-corrected clock during a read operation period.

16. The nonvolatile memory device according to claim 13, wherein the duty ratio control block outputs the duty-corrected clock based on the read enable signal in an initial period of the ZQ calibration operation period, and in a remaining period, following the initial period of the ZQ calibration operation period, receives the internal clock signal from the clock generation block, performs the duty correction operation and sets a duty ratio.

17. The nonvolatile memory device according to claim 16, wherein the duty ratio control block comprises:

a signal selection unit suitable for selecting and outputting the read enable signal or the internal clock signal in response to a select signal which defines an initial period of the ZQ calibration operation period;

a delay line unit suitable for delaying an output signal of the signal selection unit by a preset time in response to a delay line control signal, and outputting a delayed clock;

a duty ratio detection unit suitable for detecting a duty ratio of the delayed clock and outputting detection signals, in the ZQ calibration operation period;

a delay line control unit suitable for outputting the delay line control signal in response to the detection signals; and an output driver suitable for outputting the delayed clock as the duty-corrected clock during a read operation period and the ZQ calibration operation period.

18. The nonvolatile memory device according to claim 17, wherein the select signal is enabled in the remaining period, following the initial period, of the ZQ calibration operation period, and wherein the signal selection unit selects the internal clock signal when the select signal is enabled, and selects the read enable signal when the select signal is disabled.

19. The nonvolatile memory device according to claim 13, further comprising:

a frequency detection block suitable for detecting a frequency of a memory system in response to the read enable signal and outputting a duty correction enable signal, in the ZQ calibration operation period; and a low-speed operation determination block suitable for being disabled in response to the duty correction enable signal, and receiving the read enable signal and outputting an internal read enable signal, wherein the duty ratio control block receives the read enable signal, performs the duty correction operation and sets the duty ratio, in response to the duty correction enable signal, and the clock generation block selectively receives the internal read enable signal or the duty-corrected clock and generates the internal clock signal, in response to the duty correction enable signal.

20. The nonvolatile memory device according to claim 19, wherein the frequency detection block enables the duty correction enable signal when the frequency of the memory system is a high frequency, and disables the duty correction enable signal when the frequency of the memory system is a low frequency.

21. The nonvolatile memory device according to claim 19, wherein the frequency detection block comprises:

a frequency division unit suitable for dividing a frequency of the read enable signal which is inputted in the ZQ calibration operation period, by a preset number, and outputting a frequency-divided clock signal;

a code detection unit suitable for receiving the frequency-divided clock signal, detecting a level of the frequency-divided clock signal at a preset number of times, and outputting a plurality of digital codes; and a duty correction enable signal output unit suitable for determining and outputting whether to enable the duty correction enable signal, based on the plurality of digital codes.

22. A method for operating a nonvolatile memory device suitable for sequentially performing a ZQ calibration operation for impedance matching of a signal line between an external device and the nonvolatile memory device and a read operation in response to a ZQ calibration enable signal and a read enable signal, the method comprising:

entering a ZQ calibration operation period in response to the ZQ calibration enable signal;

performing a duty correction operation in response to the read enable signal and setting a duty ratio, in the ZQ calibration operation period;

receiving the read enable signal and outputting a duty-corrected clock based on the set duty ratio, in a read operation period;

generating an internal clock signal in response to the duty-corrected clock; and outputting data outputted from an internal memory cell region, in synchronization with the internal clock signal.

23. The method according to claim 22, wherein, in the ZQ calibration operation period, the read enable signal toggles during an enable period of the ZQ calibration enable signal.

24. The method according to claim 22, wherein the setting of the duty ratio in the ZQ calibration operation period comprises:

outputting the duty-corrected clock based on the read enable signal, in an initial period of the ZQ calibration operation period;

generating the internal clock signal in response to the duty-corrected clock; and receiving the internal clock signal from the clock generation block, performing the duty correction operation and setting the duty ratio, in a remaining period, following the initial period, of the ZQ calibration operation period.

25. A method for operating a nonvolatile memory device suitable for sequentially performing a ZQ calibration operation for impedance matching of a signal line between an external device and the nonvolatile memory device and a read operation in response to a ZQ calibration enable signal and a read enable signal, the method comprising:

entering a ZQ calibration operation period in response to the ZQ calibration enable signal;

detecting a frequency of a memory system in response to the read enable signal, outputting a duty correction enable signal, performing a duty correction operation in response to the duty correction enable signal and setting a duty ratio, in the ZQ calibration operation period;

receiving the read enable signal, outputting a duty-corrected clock based on the set duty ratio, and outputting the read enable signal as an internal read enable signal, in a read operation period;

selectively receiving the internal read enable signal or the duty-corrected clock in response to the duty correction enable signal, and generating an internal clock signal; and outputting data outputted from an internal memory cell region, in synchronization with the internal clock signal.

26. The method according to claim 25, wherein, in the ZQ calibration operation period, the read enable signal toggles during an enable period of the ZQ calibration enable signal.

27. The method according to claim 25, wherein the duty correction enable signal is enabled when the frequency of the memory system is a high frequency, and is disabled when the frequency of the memory system is a low frequency.

28. The method according to claim 27,
wherein, in the case where the duty correction enable signal is enabled, the duty correction operation is performed and the duty ratio is set, in the ZQ calibration operation period, and the read enable signal is inputted, the duty-corrected clock is outputted based on the set duty ratio and the internal clock signal is generated based on the duty-corrected clock, during a read operation period, and
wherein, in the case where the duty correction enable signal is disabled, the internal read enable signal is inputted and the internal clock signal is generated, during a read operation period.

* * * * *